United States Patent

Sloan, Jr. et al.

[15] 3,659,160

[45] Apr. 25, 1972

[54] INTEGRATED CIRCUIT PROCESS UTILIZING ORIENTATION DEPENDENT SILICON ETCH

[72] Inventors: Benjamin Johnston Sloan, Jr.; Billy M. Martin, both of Richardson; Loyd H. Clevenger, Dallas, all of Tex.; Roger S. Dunn, Los Angeles, Calif.

[73] Assignee: Texas Instruments Incorporated, Dallas, Tex.

[22] Filed: Feb. 13, 1970

[21] Appl. No.: 11,070

[52] U.S. Cl. ......................317/235 R, 148/175, 317/235 F, 317/235 AJ, 317/235 AS

[51] Int. Cl. ......................................................H01l 15/00

[58] Field of Search.......317/235 C, 235 X, 235 AM, 235 AS

[56] References Cited

UNITED STATES PATENTS 3,486,892 12/1969 Rosyold ..............................317/235

FOREIGN PATENTS OR APPLICATIONS 1,015,588 1/1966 Great Britain .........................317/235

1,029,767 5/1966 Great Britain .........................317/235

*Primary Examiner*—Jerry D. Craig

*Attorney*—James O. Dixon, Andrew M. Hassell, Harold Levine, Melvin Sharp, Gary Honeycutt, Michael A. Sileo, Jr., Henry T. Olsen and John E. Vandigriff

[57] ABSTRACT

Orientation-dependent etching is employed in the fabrication of a monolithic semiconductor circuit network to provide electrical isolation and increased packing density, while minimizing collector series resistance and output capacitance. Collector contact to a transistor component is made by the direct metallization of a buried low-resistivity substrate region exposed by the preferential etching operation.

8 Claims, 4 Drawing Figures

Patented April 25, 1972 3,659,160

INVENTORS
ROGER S. DUNN
BILLY M. MARTIN
BENJAMIN J. SLOAN, JR.
LOYD H. CLEVENGER

BY Gary C. Honeycutt
ATTORNEY

INTEGRATED CIRCUIT PROCESS UTILIZING ORIENTATION DEPENDENT SILICON ETCH

CROSS-REFERENCE

This application is related to a copending application of Tzu Fann Shao, Ser. No. 011,044, filed Feb. 13, 1970.

This invention relates to the fabrication of monolithic semiconductor circuit networks, and more particularly to the fabrication of an integrated circuit network having improved characteristics provided by a novel application of orientation-dependent etching.

The normal processing of epitaxial planar monolithic semiconductor circuits requires that most of the individual components be electrically isolated from each other by reverse-biased PN junctions. Such isolation is accomplished by a time consuming, high temperature diffusion which must penetrate through the complete thickness of the epitaxial layer. An additional deep diffusion is required to achieve a low series resistance contact to a buried collector region. These two diffusions are disadvantageous for several reasons. They require at least two oxide removal steps and several costly handling steps, in addition to the diffusion itself. They result in surface areas of extremely high dopant concentrations, and potentially introduce an abnormally high density of defects in the crystal structure. Since the diffusions are substantially isotropic, they spread sideways to occupy a considerable portion of the total area of the semiconductor slice, thereby severely limiting the packing density of circuit components.

Among the various methods which have been suggested to eliminate these diffusion steps is the use of dielectric isolation, especially for radiation tolerant designs. This approach is indeed attractive for certain types of circuits, in selected operating environments, but the process is not simple and it has not yet been adapted for very high packing densities.

Alternate techniques have been suggested for achieving high packing density with diffusion techniques, but they require very thin epitaxial layers since the amount of out-diffusion from isolation and collector contact areas depends directly upon the thickness of the epitaxial layer. However, such techniques introduce new problems in the form of precise and difficult control procedures that are required to reliably form the epitaxial layers. Moreover, even with the thin epi, isolation diffusion is still required, which limits packing density and involves some sacrifice in the collector series resistance if the deep collector region is omitted.

Accordingly, it is an object of the present invention to provide an improved monolithic semiconductor circuit network having a minimum collector series resistance, a low output capacitance and increased packing density. It is a further object of the invention to provide a method for the fabrication of an integrated monolithic circuit network which reduces the number of processing steps required, by eliminating the need for isolation diffusion, for example. Still further, it is an object of the invention to provide an integrated circuit structure wherein ohmic contact is provided directly to a low-resistivity buried collector region.

One aspect of the invention is embodied in a semiconductor circuit network comprising a monocrystalline semiconductor body having a substrate region predominantly of one conductivity type, a first layer thereon of opposite conductivity type, and a second layer of said one conductivity type. An etched pattern of isolation grooves is provided in said body, extending through the complete thickness of said first and second layers, and partially into said substrate region whereby a plurality of mesa-shaped regions is formed. The substrate includes a plurality of low-resistivity regions of opposite conductivity type, access to which is provided by means of said grooves. Such low-resistivity regions provide low-resistance paths to the bottom portions of the mesa-shaped regions defined by said network of grooves, and thereby permit direct ohmic connections to circuit components included in each of selected mesa regions.

An insulating layer covers the mesa regions and the groove pattern, said insulating layer having windows therein on the mesa regions for permitting electrical contact to said circuit components, and additional windows in said grooves for permitting electrical contact to said low-resistivity substrate regions which form a portion of the groove surface. A metallization system is provided on the insulation layer for the purpose of electrically interconnecting the various circuit components to complete the circuit network.

Typically the structure of the invention is comprised of a monocrystalline silicon wafer predominantly of one conductivity type, having deposited thereon an epitaxial layer of opposite conductivity type, said epitaxial layer having a diffused layer therein of said one conductivity type. In the substrate region, just below the epitaxial layer, an array of low-resistivity regions having the same conductivity type as the epitaxial layer is provided. These buried regions of low-resistivity are employed to minimize the collector series resistance of transistors fabricated in the epitaxial layer, as will be apparent to those skilled in the art.

In an alternate embodiment the epitaxial layer is replaced by first and second epitaxial layers of opposite conductivity types. However, such an approach is less practical in view of the difficulties normally encountered in the effort to obtain a thin double-epi structure.

The isolation grooves are preferably provided by orientation-dependent etching. Because such an etched pattern of grooves becomes more narrow as it extends deeper into the silicon, and because there is no lateral spacing tolerance between transistor base regions and isolation moats, the packing density obtained in accordance with the invention is exceptionally high, especially when compared with the packing densities obtainable by the use of PN junction isolation techniques.

A primary feature of the structure of the invention lies in the several functions served by the pattern of isolation grooves. That is, a single groove pattern provides not only lateral isolation between device components, and direct ohmic connection to the buried low-resistivity portions of transistor collector regions, but also provides a simultaneous definition of base geometries and resistor geometries, thereby eliminating the need for corresponding oxide removal steps. Such a combination of features provides exceptionally low collector series resistance, together with a low output capacitance and maximum packing density, through the elimination of lateral PN junction isolation.

The invention is also embodied in a method for the fabrication of the above-described semiconductor integrated structure, beginning with the step of providing a monocrystalline semiconductor wafer having a substrate region predominantly of one conductivity type and a surface layer of the opposite conductivity type, crystallographically oriented parallel to a (100) plane. The substrate region includes a plurality of distinct low-resistivity regions therein of said opposite conductivity type located adjacent the surface layer. A portion of the thickness of the surface layer is then converted to said one conductivity type by non-selectively diffusing a suitable impurity therein. A pattern of isolation grooves is then selectively and preferentially etched into said wafer surface, said pattern extending completely through the surface layer and into the substrate region, whereby the wafer is provided with an array of mesa-shaped regions. Each of the low-resistivity substrate regions lies at the base of a mesa region, and, if it is to serve as an ohmic connection path, it is partially exposed by the groove pattern which defines the mesa region. Access to the buried collector region is thereby provided, as described in connection with the structural embodiment.

An insulation layer is then formed covering the mesa regions and the surfaces of the groove pattern surrounding the mesa regions. Circuit components, including transistors, diodes, and resistors, for example, are then formed in selected mesa regions, using known techniques. Finally, the insulation layer is windowed to permit electrical interconnection of the components, followed by the deposition and patterning of a metal contact system on the windowed insulation layer.

A primary feature of the preferred process embodiment of the invention involves the use of orientation-dependent etching to remove silicon and thereby define the array of mesa-shaped isolated regions. A suitable etch solution comprising potassium hydroxide, propanol and water removes silicon at a well-controlled rate in the range of 0.5 to 1.5 microns per minute depending on the temperature and rate of agitation, in a direction normal to the (100) plane. This solution does not appreciably attack the silicon in a direction normal to the (111) plane. The resulting etched area has flat, well-defined, sloping sides forming an angle of approximately 54.7° with the (100) plane. The etched groove will bottom out into a "V" shape at which time the etch rate drops to essentially zero.

The depth of the groove depends on the width of the opening provided in the etch mask on the wafer surface, and only slightly upon the etch time, if bottoming is complete. For etch times less than that required for bottoming, the etch depth depends upon etch time in a controllable manner, resulting in a smooth, flat-bottomed slot. For purposes of the present invention the width of openings provided in the etch mask is sufficient to provide etched slots which bottom out below the epitaxial layer, thereby isolating an array of mesa-shaped regions. On one side of each isolated mesa-shaped region wherein a transistor is to be fabricated, the opening width in the etch mask will be made great enough to provide an isolation groove having a relatively wide, flat bottom located at least partially within the low-resistivity substrate region which provides a low resistivity collector contact.

Figures 1, 2, 3, 4:
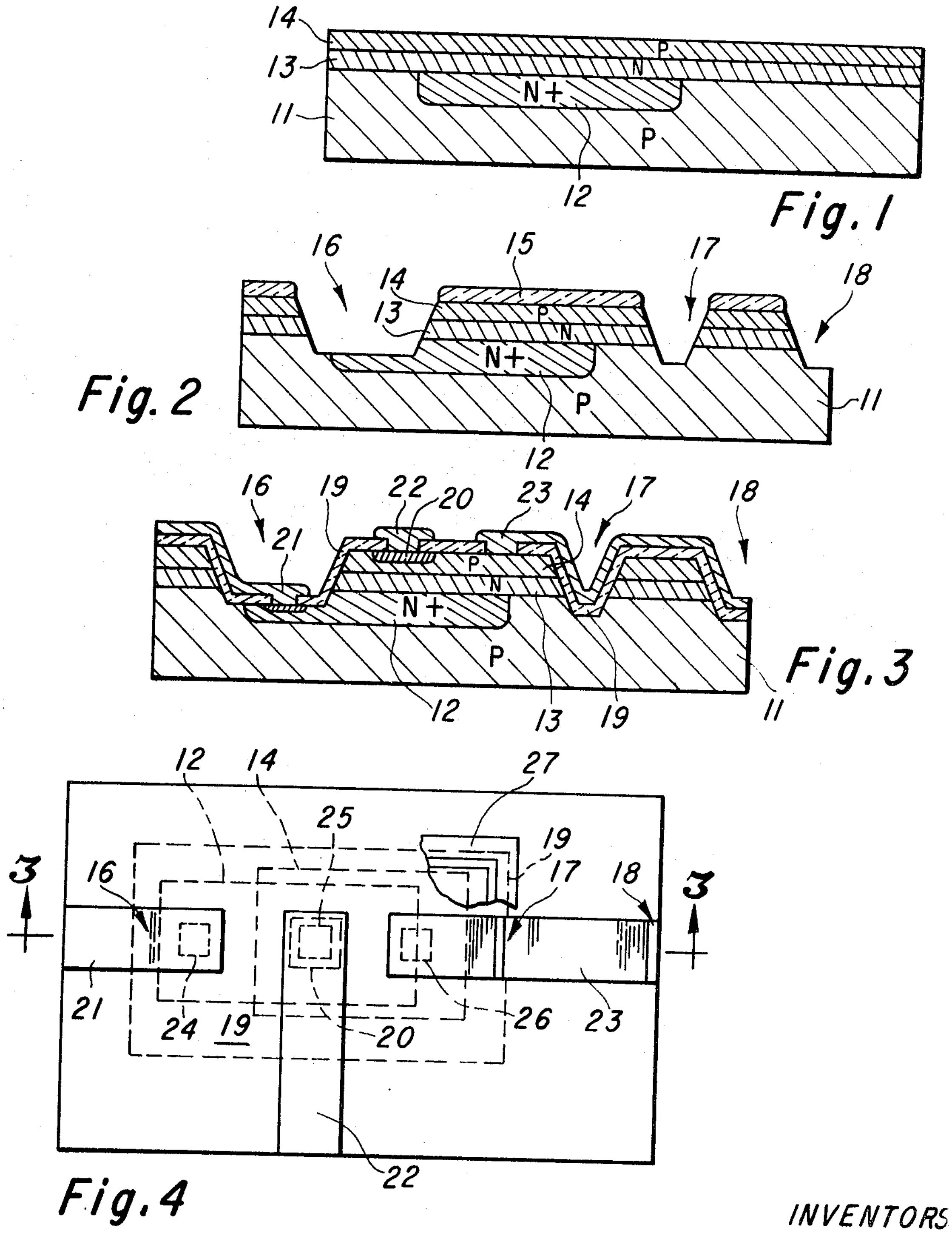
FIGS. 1 and 2 are greatly enlarged fragmentary diagrammatic cross-sectional views of a monocrystalline silicon wafer, illustrating intermediate processing stages in the fabrication of the structure of the invention.
FIG. 3 is a greatly enlarged diagrammatic cross-sectional view of the wafer shown in FIGS. 1 and 2, illustrating a completed structure of the invention.
FIG. 4 is an enlarged diagrammatic plan view of the structure illustrated in FIG. 3.

As shown in FIG. 1, wafer 11 is a monocrystalline silicon body crystallographically oriented to expose an upper surface parallel to a (100) plane. The wafer is predominantly of P-type conductivity and has a resistivity of 2 to 5 ohm-centimeters, provided by boron doping, for example. Other semiconductors and other dopants are also useful, as will be apparent to those skilled in the art.

Region 12 of N-type conductivity is one of a plurality of such regions provided by selective diffusion of arsenic, for example, or other donor impurity, to provide a sheet resistance of about 15 to 25 ohms per square. Epitaxial film 13 of N-type conductivity, deposited across the entire wafer surface, has a thickness of about 0.1 to 0.5 mils and a resistivity of about 0.1 to 3.0 ohm-centimeters. A non-selective diffusion of boron or other suitable acceptor impurity is then carried out in accordance with known techniques to provide layer 14 having a thickness of about 1 to 5 microns and a sheet resistance of 150 to 200 ohms per square.

As shown in FIG. 2, an etch-resistant mask layer 15 of silicon dioxide, for example, is provided having a rectangular pattern of openings therein. The masked wafer is then subjected at 65° C. to an orientation-dependent etch solution consisting, for example, of 250 grams of potassium hydroxide dissolved in a mixture of 250 millimeters propanol and 800 millimeters water to form a pattern of etched grooves designated by arrows 16, 17 and 18. For this embodiment it is essential that the groove pattern extend through the complete thickness of the epitaxial layer or layers in order to provide electrical isolation of the resulting mesa-shaped component regions. Groove 16 is bottomed within region 12 to permit direct ohmic connection thereto.

In other embodiments, a further increase in the packing density of diffused resistors and/or diodes is provided by using a shallower groove pattern surrounding and defining mesa regions wherein layer 14 is used by itself in forming a circuit component. In such embodiments it is sufficient to bottom a portion of the groove pattern just below the junction formed by layers 13 and 14, since this junction provides vertical electrical isolation of such components, instead of the junction between layer 13 and the substrate.

As shown in FIG. 3, wafer 11 is then covered by insulation layer 19 which may conveniently consist in part of masking layer 15, together with an oxide layer covering the groove pattern, produced by thermal oxidation subsequent to the completion of the etch operation. Emitter region 20 is then provided by selective diffusion of a donor impurity using known techniques. Insulation layer 19 is then selectively etched to provide windows for ohmic contact to regions 12, 14 and 20 respectively, followed by the deposition and patterning of a metal film such as aluminum, for example, to provide contacts 21, 22 and 23.

No electrical connection is shown for the mesa region between grooves 17 and 18; however, this region is available for use as a diffused resistor or resistors. That is, layer 14 is useful by itself as a single resistor, or it may be used in addition to layer 13 to provide two separate resistors. This would require, of course, that a reverse bias be maintained across the junction between the two layers. When layer 13 is used as a resistor, ohmic connection thereto is provided by the use of a low-resistivity substrate region, like region 12, and a groove pattern extending thereto, in the same manner as the collector connection is made to the illustrated transistor.

The complete network of the invention typically includes a large number of mesa regions like the illustrated mesa region, wherein other components are fabricated and interconnected in accordance with known techniques, such as various types of transistors, diodes, etc.

In FIG. 4 a plan view of the structure is shown, including dashed rectangles to show the underlying boundaries of the collector, base, and emitter regions, together with oxide windows 24, 25 and 26, through which ohmic contact is established to regions 12, 20 and 14 respectively. The surface geometry of the mesa-shaped region is indicated in fragmentary form by reference number 27.

In addition to the embodiments specifically disclosed, it will be apparent that the invention encompasses other embodiments wherein the dimensions, resistivities, conductivity types, dopants, etching rates, etching solutions, etc. differ significantly from the examples given.

What is claimed is:

1. A semiconductor circuit network comprising:

a. a monocrystalline semiconductor body having a substrate region predominantly of one conductivity type, a first semiconductor layer thereon predominantly of opposite conductivity type, and a second semiconductor layer, of said one conductivity type, on said first layer, said layers having (100) crystallographic orientation;

b. said body having a pattern of isolation grooves extending through said first and second semiconductor layers and partially into said substrate region, said grooves having substantially flat side-walls parallel to a (111) crystallographic plane, whereby said body is provided with a plurality of mesa-shaped regions;

c. a plurality of low-resistivity regions of said opposite conductivity type in said substrate, access to which is provided by means of said grooves;

d. a semiconductor component within each of selected mesa regions;

e. an insulating layer covering said mesas and said grooves, said insulating layer having windows on said mesas to permit electrical contact to said components, and windows in said grooves to permit electrical contact to the low-resistivity regions of said substrate; and f. a thin-film metallization pattern on said insulation layer, extending into and from said grooves, ohmically interconnecting said components to form a circuit network.

2. A circuit network as defined by claim 1 wherein said semiconductor is silicon, and said side-wall angle is about 54.7°.

3. A circuit network as defined by claim 1 wherein said semiconductor substrate is P-type silicon, and said low-resistivity regions therein are N-type silicon having a resistivity of less than 25 ohms per square.

4. A circuit network as defined by claim 1 wherein said first layer has a resistivity of 0.1 to 3.0 ohm-centimeters.

5. A circuit network as defined by claim 1 wherein said second layer is substantially coextensive in area with the upper surface of said mesas, and has a thickness of 1 to 5 microns and a sheet resistance of about 150 to 200 ohms per square.

6. A semiconductor circuit network comprising:

a. a monocrystalline semiconductor body having a substrate region predominantly of one conductivity type, a first semiconductor layer thereon predominantly of opposite conductivity type, and a second semiconductor layer, of said one conductivity type, on said first layer;

b. said body having a pattern of isolation grooves extending through said first and second semiconductor layers and partially into said substrate region, said grooves having substantially flat side-walls parallel to a crystallographic plane forming an angle substantially less than 90° with each of said layers, whereby said body is provided with a plurality of mesa-shaped regions;

c. a plurality of low-resistivity regions of said opposite conductivity type in said substrate, access to which is provided by means of said grooves;

d. a semiconductor component within each of selected mesa regions, a portion of said first semiconductor layer serving as transistor collector regions in selected mesas, and another portion thereof serving as resistors in other selected mesas;

e. an insulating layer covering said mesas and said grooves, said insulating layer having windows on said mesas to permit electrical contact to said components, and windows in said grooves to permit electrical contact to the low-resistivity regions of said substrate, said low-resistivity regions providing ohmic contact to said collector regions, and to said resistor regions, respectively; and f. a thin-film metallization pattern on said insulation layer extending into and from said grooves, ohmically interconnecting said components to form a circuit network.

7. A circuit network as defined by claim 6 wherein said semiconductor is silicon, and said side-wall angle is about 54.7°.

8. A circuit network as defined by claim 6 wherein said second semiconductor layer is substantially coextensive in area with the upper surface of said mesas, and has a thickness of 1 to 5 microns and a sheet resistance of about 150 to 200 ohms per square.

* * * * *